US005893729A

United States Patent [19]
Roisen et al.

[11] Patent Number: 5,893,729
[45] Date of Patent: Apr. 13, 1999

[54] METHOD OF MAKING SOI CIRCUIT FOR HIGHER TEMPERATURE AND HIGHER VOLTAGE APPLICATIONS

[75] Inventors: Roger L. Roisen, Minnetrista; Jeffrey S. Kueng, New Brighton, both of Minn.

[73] Assignee: Honeywell Inc., Minneapolis, Minn.

[21] Appl. No.: 08/671,100

[22] Filed: Jun. 28, 1996

Related U.S. Application Data

[63] Continuation of application No. 08/495,141, Jun. 28, 1995, abandoned.

[51] Int. Cl.$^6$ .................................................. H01L 21/00

[52] U.S. Cl. .................... 438/163; 438/164; 438/154; 438/228

[58] Field of Search ..................... 438/153, 154, 438/163, 164, 228

[56] References Cited

U.S. PATENT DOCUMENTS

| | | | |
|---|---|---|---|
| 4,232,327 | 11/1980 | Hsu | 437/44 |
| 5,024,965 | 6/1991 | Chang et al. | 437/62 |
| 5,306,656 | 4/1994 | Williams et al. | 437/44 |
| 5,416,043 | 5/1995 | Burgener et al. | 437/62 |
| 5,426,062 | 6/1995 | Hwang | 438/154 |
| 5,440,161 | 8/1995 | Iwamatsu et al. | 438/154 |

*Primary Examiner*—Trung Dang
*Attorney, Agent, or Firm*—Gregory A. Bruns

[57] ABSTRACT

Method for forming a CMOS transistor in a silicon layer positioned above an underlying buried oxide layer including isolating a first active area and a second active area; forming an n-well and a p-well having specified back gate threshold voltages; forming gates over the wells; forming a lightly doped drain region in the p-well that extends through the silicon layer; and implanting ions to form a source and a drain region in the p-well to provide a lightly doped drain drift region.

16 Claims, 5 Drawing Sheets

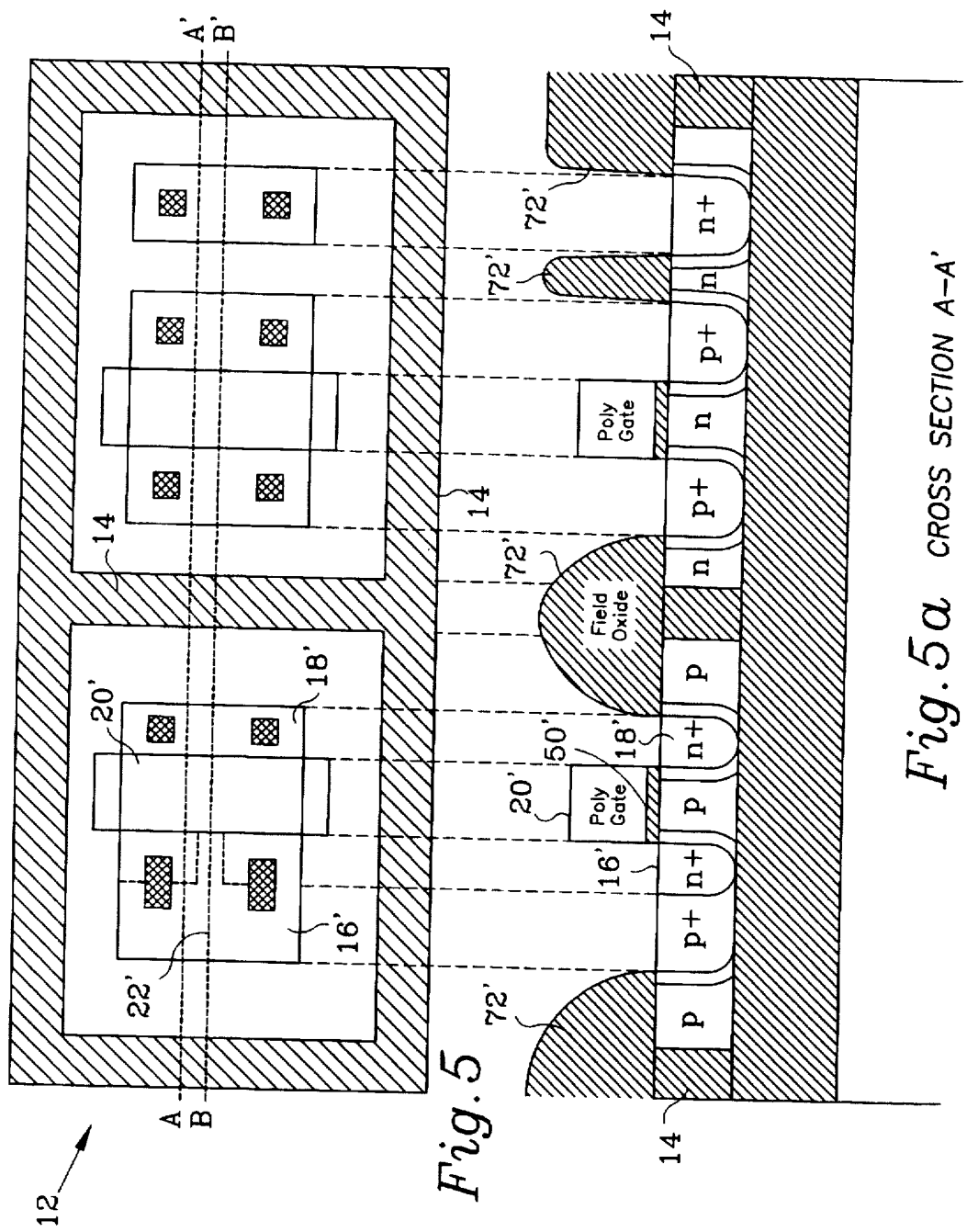
Fig.5    Fig.5a CROSS SECTION A-A'

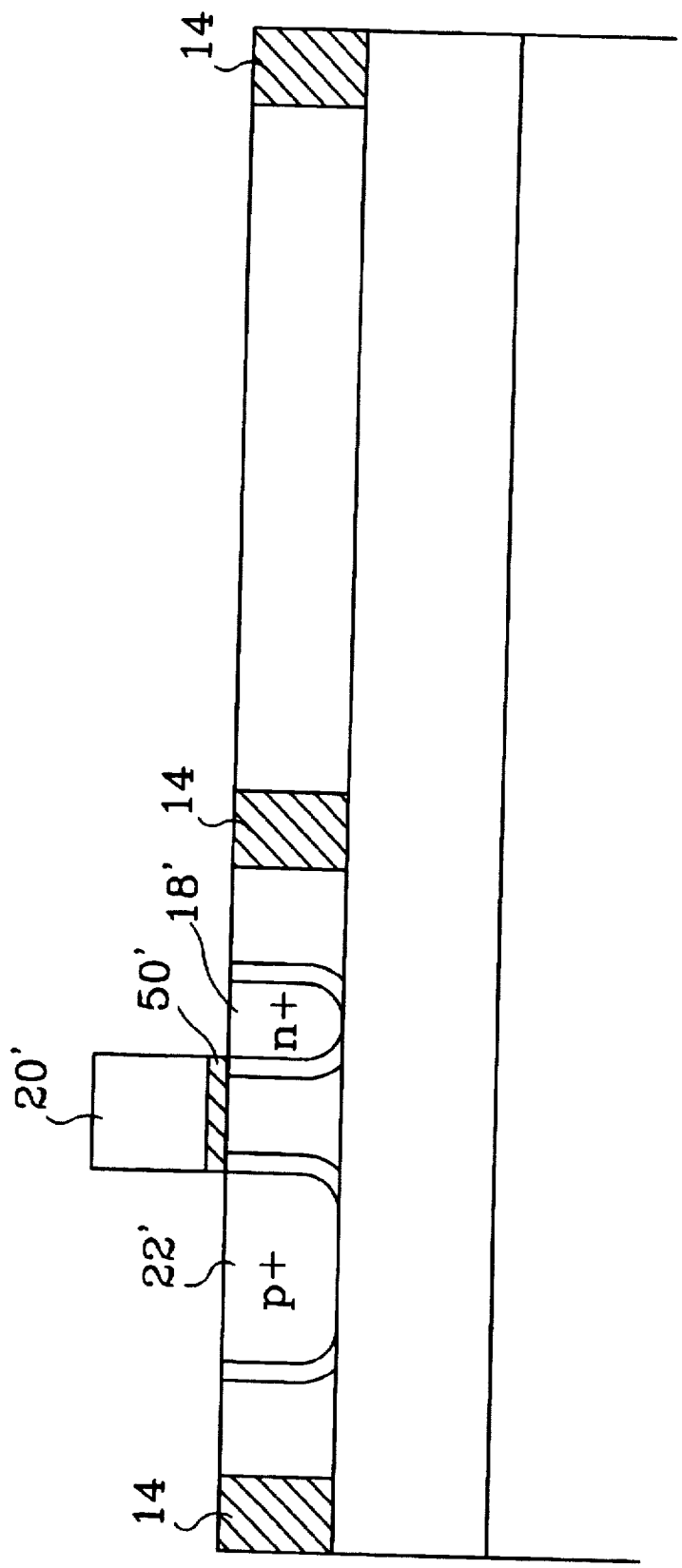
Fig.5b CROSS SECTION B-B'

METHOD OF MAKING SOI CIRCUIT FOR HIGHER TEMPERATURE AND HIGHER VOLTAGE APPLICATIONS

This application is a continuation of application Ser. No. 08/495,141, filed Jun. 28, 1995 now abandoned.

BACKGROUND OF THE INVENTION

The present invention relates to CMOS and specifically to CMOS circuits for use at the combination of higher temperatures and higher power supply voltages than have been available in the past.

Specific application needs for high temperature electronics include the need to operate at ambient temperatures in the 350° C. range and the need to operate with higher than 5 volt power supply voltages. For example, some applications require operation with power supply voltages in the range of 12–14 volts or higher. Conventional CMOS circuits of the past, typically do not operate at temperatures above 180 to 200° C. and then only operate with lower power supply voltages.

N-channel transistors subjected to a high drain to source voltage, Vds, generate a hole current in the body of the device near the p-well/n-ldd junction. This hole current is related to the maximum lateral electric field and flows through the p-well region to the nearest p-well contact. In a bulk technology this body hole current doesn't cause problems because the path to the nearest p-well contact is typically a low resistance vertical path due to it having a large cross-sectional area; whereas, in an SOI technology the presence of the buried oxide forces the current to flow laterally beneath the transistor out to a topside p-well contact through a highly resistive path. This path is highly resistive due to its small cross-sectional area.

This p-well connection is referred to as a body tie. Typical SOI designs allow for 10 to 20 microns of distance between the body tie and the conducting channel. The further the distance that the substrate current has to travel the higher the voltage drop is across the p-well. That is, as substrate current flows down the channel towards the body tie, i.e., Vss or ground, it creates a voltage drop. The voltage drop will eventually be enough to forward bias the N+ source to p-well diode thus causing a self-sustaining single transistor latch condition referred to as "snapback". This substrate current is normally known in the art as the cause of latch up.

Thus a need exists in specific applications for a CMOS device that will operate at temperatures in the 350° C. range and with power supply voltages in the 12 to 14 volt range.

SUMMARY OF THE INVENTION

The present invention solves these and other needs by providing a method for forming a CMOS transistor in a silicon layer, having a silicon layer thickness and positioned above an underlying buried oxide layer, comprising the following steps:

isolating a first active area and a second active area in said silicon layer;

forming an n-well in said first active area, said n-well having a parasitic back gate threshold greater than a first voltage and a lightly doped drain to n-well junction avalanche breakdown greater than a second voltage;

forming a p-well in said second active area, said p-well having a parasitic back gate threshold greater than a third voltage;

forming a first gate over said n-well and a second gate over said p-well;

implanting ions of a first conductivity type into said p-well to form a lightly doped drain region while protecting a region below said first gate and protecting said n-well from said ions, said lightly doped drain region extending through said silicon layer thickness;

annealing said lightly doped drain region;

forming a source and drain region in said n-well; and implanting ions of a first conductivity type to form a source and a drain region in said p-well while protecting a p-well region at said drain to provide a lightly doped drain drift region.

BRIEF DESCRIPTION OF THE DRAWINGS

FIG. 5 is a top plan view of a CMOS device according to the present invention.

FIG. 5a is a cross-sectional view along section line A–A'.

FIG. 5b is a cross-sectional view along section line B–B'.

DETAILED DESCRIPTION

Figure 1:
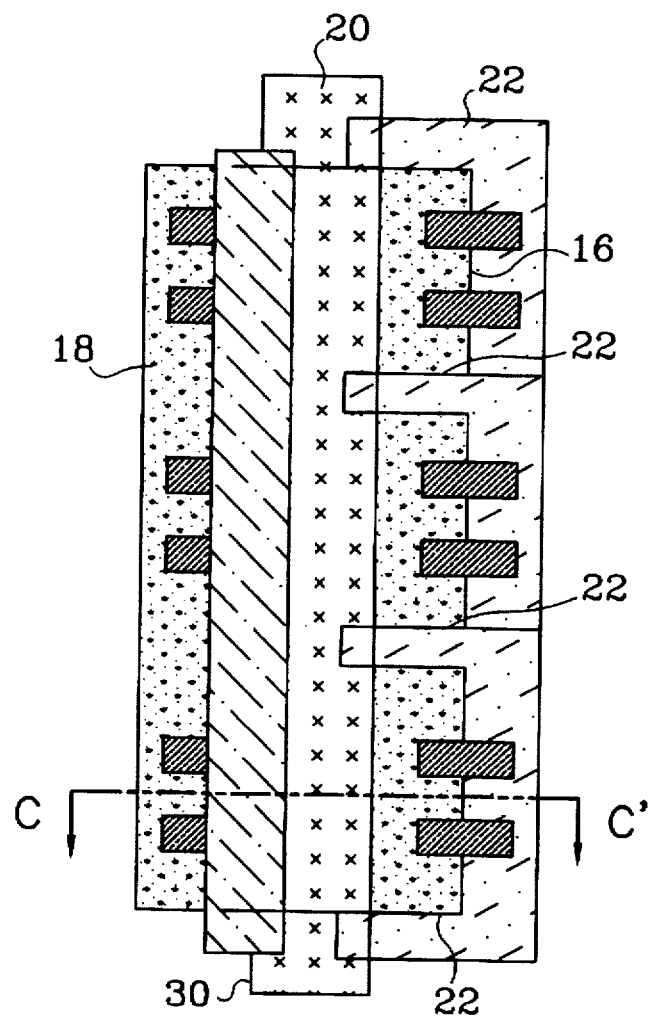
FIG. 1 is a top plan view of an N-channel portion of an integrated circuit device constructed according to the present invention.
Figure 1:
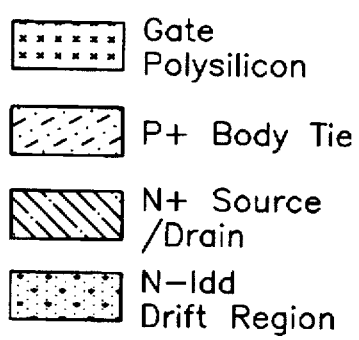

FIG. 1 shows a top view of a portion of an SOI integrated circuit for an n-channel transistor layout with source 16, drain 18 and gate 20. Also shown are individual P+ body ties 22 which abut gate 20. An n-ldd drift region 30 is defined by photoresist to create an asymmetrical device with a nonself-aligned, lightly-doped drain.

Figure 2:
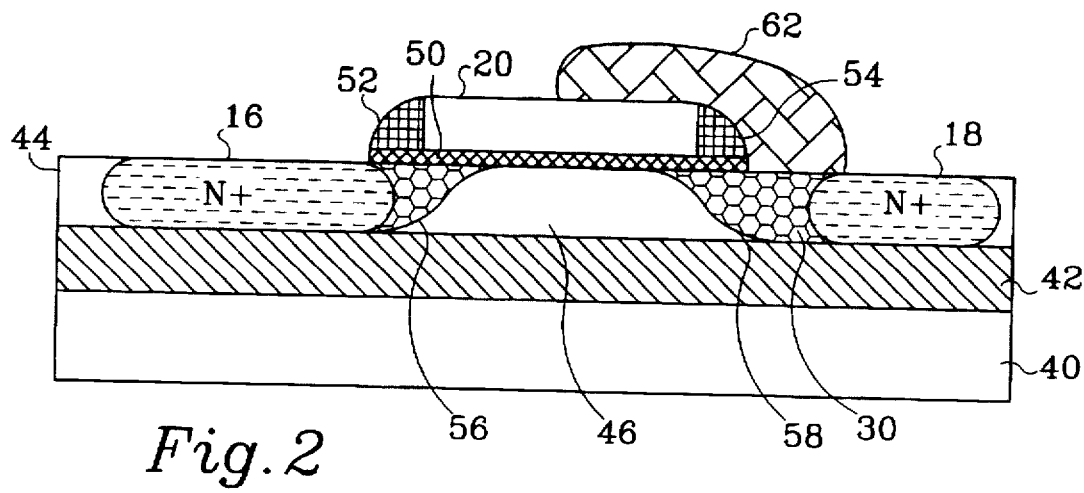
FIG. 2 is an enlarged cross section view of the circuit of FIG. 1 along section line C–C'.

FIG. 2 is a cross-sectional drawing of the device of FIG. 1 showing a p-substrate 40, buried oxide layer 42 and top silicon layer 44. Formed in and on top silicon layer 44 are source 16, drain 18, channel region 46, gate 20, gate oxide 50, and spacers 52 and 54. Also shown is lightly-doped portion 56 at source 16 and lightly-doped portion 58 at drain 18. In addition, a drift region 30 which is protected during processing by photoresist 62 is shown.

Referring to FIG. 5, a top plan view of a CMOS device 12 according to the present invention is shown. Device 12 includes variable width trench isolation 14. In FIG. 5, a "'" designation is used to identify similar portions to those of FIGS. 1 and 2. Trench isolation 14 is shown in FIG. 5. FIG. 5a shows a cross-section through source 16' and drain 18' of the N-channel portion of FIG. 5. FIG. 5b shows a section through the N-channel portion that includes embedded body tie 22'.

A description of the method of the present invention is now provided.

1) SOI Material Preparation. The substrate material is SOI (silicon on insulator) with a buried oxide thickness of 1.0 microns or greater. Top silicon thickness is preferably 0.45 microns pre-processing and 0.33 microns post processing. The thickness of the buried oxide (BOX) is directly proportional to the room temp threshold voltage of the parasitic back gate. As BOX thickness is increased the threshold voltage also increases. This allows for the process to lower the p-type doping at the back gate interface, i.e., the p-well concentration. The room temperature threshold voltage, Vt, for the back gate is chosen such that at 350° C. there is still at least 1 decade of difference in current from "off" to "on". The back gate threshold voltage, Vtbg, is now set at the absolute minimum it can be for high temperature operation. This is important as the avalanche breakdown voltage for the n+, n-ldd to p-well junction is set indirectly by this peak concentration in the p-well. This same logic is followed for the p-channel transistor.

2) Variable width trench isolation. Trenches are formed via a LOCOS process and HIPOX oxidation. This process allows for infinite trench widths, thus eliminating any need for field isolation.

3) Sacrificial oxidation.

4) N-tub photo cut and implant. The doping is tailored such that the parasitic back gate threshold is above 30 volts at 25° C. and the p-ldd to n-well junction avalanche breakdown is above 15 volts. Concentration is in the range of 2e16 ions/cm3 ($2\times10^{16}$ ions/cm$^3$) to 6e16 ions/cm3 achieved with a nominal implant of 3.3e12 ions/cm2 ($3.3\times10^2$ ions/cm$^2$).

5) P-tub photo cut and implant. The doping is tailored such that the parasitic back gate threshold is above 30 volts. The n-ldd to p-well junction profile is influenced by the p-well concentration and must be nominally 1.5e17 ions/cm3 at the back interface and 3.5e16 ions/cm3 at the top interface.

6) Field oxidation. A selective polysilicon oxidation (SEPOS) field oxidation process is used to form field isolation. No field transistor threshold adjust implant is needed as all transistors are isolated via the trench. It is important to note that the lack of a field threshold implant improves the n-ldd to p-well breakdown voltage.

7) Sacrificial oxidation for threshold voltage, Vt, implants.

8) Vt adjust implant for p-channel with a dose in the range of 5e12 ions/cm2 to 9e12 ions/cm2.

9) Sacrificial oxide removal and gate oxidation of a range of 300–400 angstroms with 350 angstroms found experimentally to work well.

10) Gate polysilicon deposition of a thickness of 3300 angstroms to 4000 angstroms deposited by LPCVD.

11) Gate photo cut and etch.

12) Double photo resist n-ldd photo cut. The gate poly photo cut photo-resist is left intact so as to protect the active channel region from subsequent processing.

Figure 3:
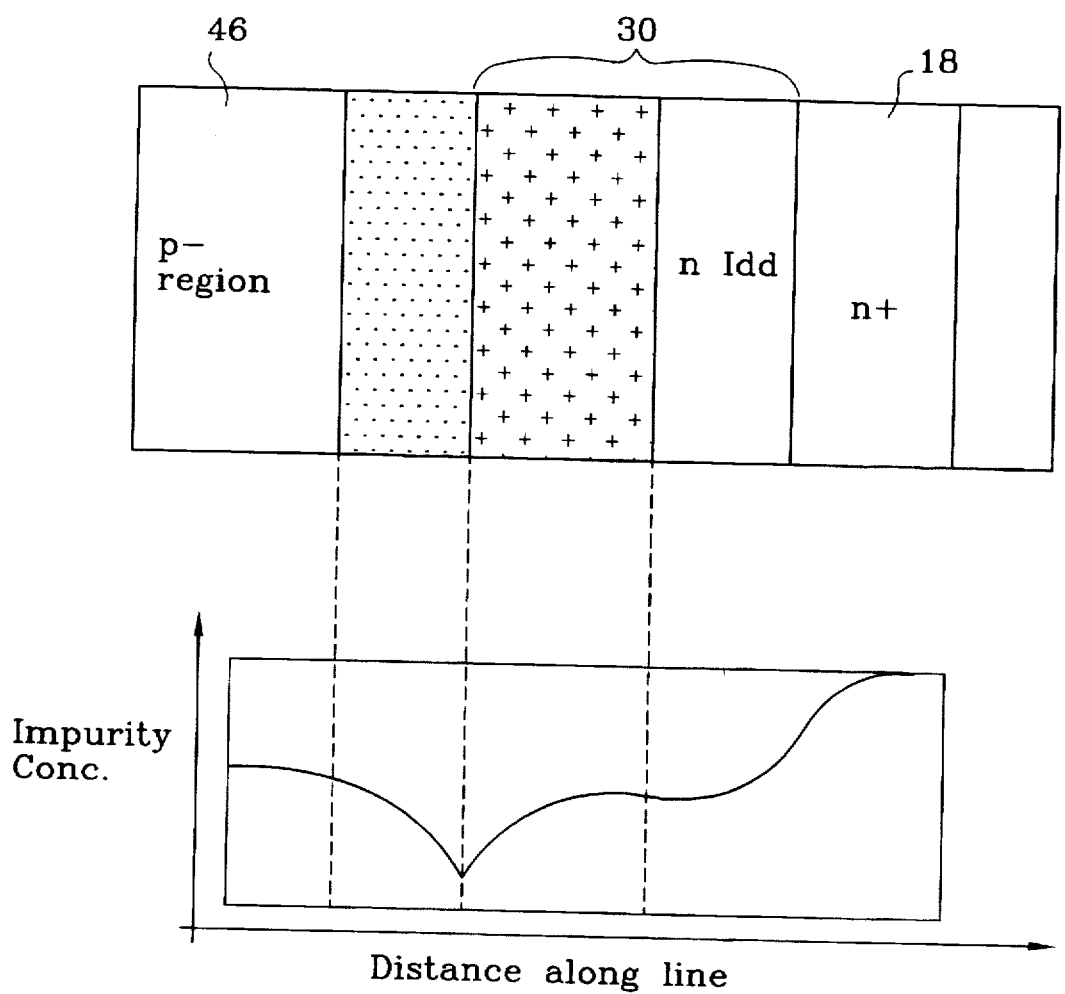
FIG. 3 is a diagram of certain conditions within the N-channel device of FIG. 1.
Figure 4:
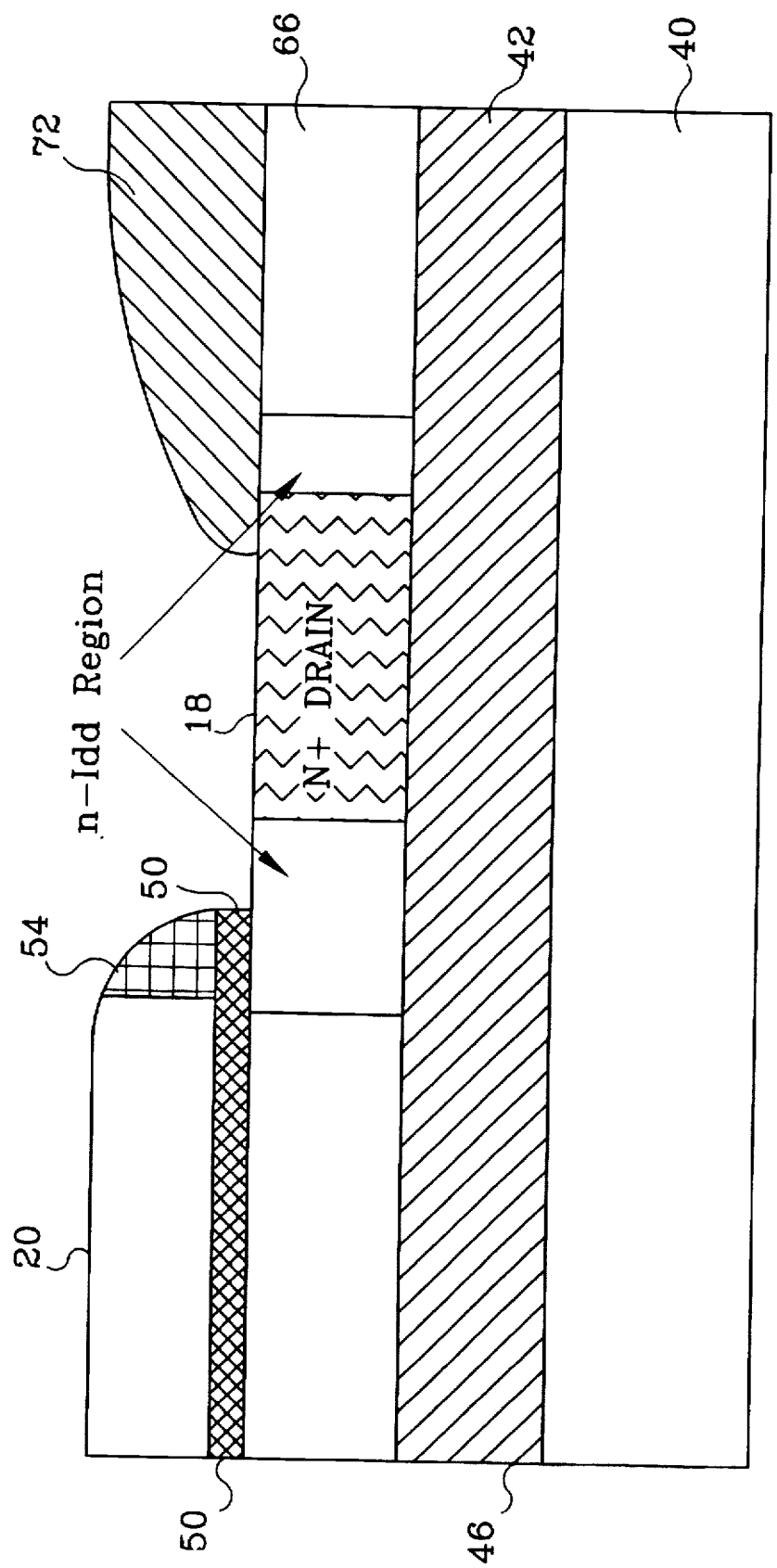
FIG. 4 is an enlarged view of a portion of FIG. 2 which shows additional details.

13) Dual n-ldd phosphorous implant. Two implants, along with an ldd drive in diffusion, are performed in order to tailor the n-ldd to p-well junction. The first N-ch ldd implant is of very high energy, i.e., greater than 130 Kev effective energy @ 45° tilt and the 2nd implant is of low energy, i.e., 60 keV effective at 45° tilt. In order to accomplish this, a "double photo resist" process is used. That is, after definition of gate polysilicon and RIE etching the photoresist used to define the poly gate is left intact. An additional photo cut is now implemented to protect the p-channel transistors from the n ldd implant. By leaving the photoresist intact over the gate poly 20, one is allowed to increase the energy of the ldd implant. Normally the limiting factor in the ldd implant energy is the penetration of the dopant through the gate poly and thus changing the effective charge in the gate oxide region. This results in unknown and variable threshold voltages. By doing two implants, i.e., low and high energy, the doping profile of the ldd region can be tailored to be rather uniform down to the buried oxide. The actual value for the average concentration of the ldd region was found experimentally to be about 1.5E17 to 2.0E17 ions/cm3. Following the implants, The ldd region is annealed in step 15 at 950° C. for 30 minutes prior to doing the N+ source/drain implant, thus extending the region under the gate further than a conventional process. The ldd is now "bottomed out" vertically to the buried oxide. This is important as the N+ drain region 18 must not be allowed to be juxtaposed to the p-well 46. The purpose for the sequence and method of ldd formation is to create a longer and deeper ldd region than normally obtained by a conventional ldd process as illustrated in FIG. 3 where the metallurgical junction is the n-ldd to p-well junction. The longer and deeper ldd region insures the depletion region in the ldd will not extend to the N+ region as the avalanche breakdown voltage would be decreased. On the field oxide edge (depicted in FIG. 4) of the device it is required that the depletion region from the field p-well to the ldd region not extend across the ldd region and into the N+ region. This would result in early avalanche breakdown voltages below the maximum power supply. This is avoided with the use of the high energy ldd and the ldd drive in diffusion.

14) p-ldd photo cut and implant. This is required to improve p-channel avalanche breakdown voltage. The doping concentration is in the range of 9e17 ions/cm3 to 2e18 ions/cm3.

15) Ldd drive-in diffusion. This is required to drive both p-ldd and n-ldd laterally under the gate and vertically down to the buried oxide.

16) P-channel source/drain photo cut and implant. This step includes providing an embedded body tie arrangement. This is illustrated with the P+ body ties labeled 22 in FIG. 1. By placing p+ straps 22 abutting gate 20 approximately every 8–10 microns, the substrate current is shunted to Vss or ground. That is p+ straps 22 extend to beneath an edge of gate 20' and provide a low resistance current path from beneath gate 20 for substrate current. After diffusion, the p-region beneath gate 20 and the p+ strap will merge together.

17) N-channel source/drain photo cut and implant. As depicted in FIG. 2, during the source/drain formation, the design required the use of extended ldd drift regions on all n-channel transistors that will be subject to greater than 8 volts Vds. This does not require an additional masking step, but merely an editing of the source/drain layer before mask generation. In FIG. 1 the n-ldd drift region 30 is shown as it would be laid out. This region would actually be a source/drain blanking layer that prevents the N+ implant from being implanted next to the oxide spacer 54, i.e., an extension of the oxide spacer defined with photo resist 62. The purpose of this is to reduce the maximum electric field near and under the gate polysilicon, giving the transistor the ability to withstand greater Vds. The concentration is in the range of 8e19 to 2e20 ions/cm3.

18) Contact glass deposition, source, drain anneal at 900° C. 15 mins. photo cut and etch.

19) CMOS 2 layer metal process with a barrier metal compatible with high temp.

Now that the process has been described, certain other aspects of the invention will be discussed.

Elimination of the field oxide channel stop implant and the use of all trench isolation. Conventional processes would require the use of a field oxide channel stop implant to prevent leakage between n-channel transistors, especially when polysilicon lines over the field isolation oxide are biased at voltages greater than the threshold voltage. In this process the use of a variable width LOCOS trench eliminates the need for this implant. If this implant were required, the avalanche breakdown voltage of the n-ldd to p-well on the field oxide edge (FIG. 4) would be too low to obtain Vdd>14 volts.

The p-channel transistor also requires the use of a p-ldd implant. This implant is performed like any typical high performance CMOS process. Again the P+ source/drain implant is performed after the 950° C. anneal. The process still requires oxide spacers for the p-channel to increase maximum Vds. The oxide spacer process is conventional.

All of the above mentioned process and design methods combine to provide a CMOS process that will function reliably at 350° C. with power supplies up to and including 14 volts.

The scope of the invention is not to be limited by the foregoing description but by the appended claims.

It is claimed:

1. Method for forming a CMOS transistor in a silicon layer having a thickness and positioned above an underlying buried oxide layer, comprising the steps of:

isolating a first active area and a second active area in said silicon layer;

forming an n-well in said first active area;

forming a p-well in said second active area;

forming a first gate over said n-well and a second gate over said p-well;

forming a lightly doped drain region in said silicon layer adjacent said second gate and extending through said thickness of said silicon layer; and forming a source region and a drain region in said p-well with said drain region in said p-well spaced from a first edge of said second gate to provide an extended drift region.

2. Method of claim 1 wherein said step of forming lightly doped drain regions in said silicon layer adjacent said second gate includes the step of performing a first implant and a second implant of impurity ions.

3. Method of claim 2 wherein said step of forming a source region and a drain region in said n-well includes the step of forming an embedded body tie at an edge of said second gate to shunt substrate current to ground.

4. Method for forming a CMOS transistor in a silicon layer having a thickness and positioned above an underlying buried oxide layer, comprising the steps of:

isolating a first active area and a second active area in said silicon layer;

forming an n-well in said first active area;

forming a p-well in said second active area;

forming a first gate over said n-well and a second gate over said p-well;

forming lightly doped drain regions in said silicon layer adjacent said second gate and extending through said thickness of said silicon layer;

forming lightly doped drain regions in said silicon layer adjacent said first gate;

forming a source region and a drain region in said n-well; and forming a source region and a drain region in said p-well with said drain region in said p-well spaced from a first edge of said second gate to provide an extended drift region.

5. Method of claim 4 wherein said step of isolating a first active area and a second active area includes the step of forming isolation trenches.

6. Method of claim 4 wherein said step of forming lightly doped drain regions in said silicon layer adjacent said second gate includes the step of performing a first implant and a second implant of impurity ions.

7. Method of claim 6 wherein said first implant is performed at a first angle, said second implant is performed at a second angle and said impurity ions are phosphorous.

8. Method of claim 4 wherein said step of forming a source region and a drain region in said p-well includes the step of blanking an area to prevent a source drain implant from entering said area.

9. Method of claim 4 wherein said step of forming a source region and a drain region in said n-well includes the step of forming an embedded body tie at an edge of said second gate to shunt substrate current to ground.

10. Method of claim 8 wherein said step of forming a source region and a drain region in said p-well locates said drain region in a spaced relationship from an opposite edge of said second gate.

11. Method for forming a CMOS transistor in a silicon layer having a thickness and positioned above an underlying buried oxide layer, comprising the steps of:

isolating a first active area and a second active area in said silicon layer;

forming an n-well in said first active area;

forming a p-well in said second active area;

said n-well and said p-well each being formed to have a back gate threshold voltage greater than a first voltage;

forming a first gate over said n-well and a second gate over said p-well;

forming lightly doped drain regions in said silicon layer adjacent said second gate and extending through said thickness of said silicon layer, with said lightly doped drain region adjacent a drain side of said second gate providing an extended length drift region;

forming lightly doped drain regions in said silicon layer adjacent said first gate;

forming a source region and a drain region in said n-well; and forming a source region and a drain region in said p-well.

12. Method of claim 11 wherein said step of isolating a first active area and a second active area includes the step of forming isolation trenches.

13. Method of claim 11 wherein said step of forming a source region and a drain region in said p-well includes the step of blanking an area to prevent a source drain implant from entering said area.

14. Method of claim 13 wherein said step of forming lightly doped drain regions in said silicon layer adjacent said second gate includes the step of performing a fist phosphorus implant and a second phosphorus implant.

15. Method of claim 14 wherein said step of forming a source region and a drain region in said p-well locates said drain region in a spaced relationship from an opposite edge of said second gate.

16. Method of claim 15 wherein said step of forming a source region and a drain region in said n-well includes the step of forming an embedded body tie at an edge of said second gate to shunt substrate current to ground.

* * * * *